(12) United States Patent
Kim et al.

(10) Patent No.: US 10,622,029 B2
(45) Date of Patent: Apr. 14, 2020

(54) MEMORY MODULE, MEMORY SYSTEM HAVING THE SAME AND ARRANGEMENT METHOD OF A BOARD

(71) Applicant: Samsung Electronics Co., Ltd., Suwon-si, Gyeonggi-do (KR)

(72) Inventors: Dong Yeop Kim, Hwaseong-si (KR); Jae Jun Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/050,134

(22) Filed: Jul. 31, 2018

(65) Prior Publication Data
US 2019/0259426 A1 Aug. 22, 2019

(30) Foreign Application Priority Data

Feb. 21, 2018 (KR) .................. 10-2018-0020372

(51) Int. Cl.
| | | |
|---|---|---|
| *G11C 5/00* | (2006.01) | |
| *G11C 5/06* | (2006.01) | |
| *G11C 5/02* | (2006.01) | |
| *H05K 1/11* | (2006.01) | |
| *H05K 1/16* | (2006.01) | |
| *H05K 1/18* | (2006.01) | |
| *G11C 5/04* | (2006.01) | |

(52) U.S. Cl.
CPC .................. *G11C 5/06* (2013.01); *G11C 5/02* (2013.01); *G11C 5/04* (2013.01); *G11C 5/063* (2013.01); *H05K 1/115* (2013.01); *H05K 1/162* (2013.01); *H05K 1/181* (2013.01); *H05K 2201/095* (2013.01); *H05K 2201/10159* (2013.01)

(58) Field of Classification Search
CPC . G11C 5/06; G11C 5/02; H05K 1/115; H05K 1/162; H05K 1/181; H05K 2201/095; H05K 2201/10159
See application file for complete search history.

(56) References Cited

U.S. PATENT DOCUMENTS

| | | | |
|---|---|---|---|
| 5,745,333 | A | 4/1998 | Frankeny et al. |
| 5,972,231 | A | 10/1999 | Dibene, II |
| 6,414,904 | B2 | 7/2002 | So et al. |
| 6,710,255 | B2 | 3/2004 | Ross et al. |

(Continued)

FOREIGN PATENT DOCUMENTS

| | | |
|---|---|---|
| KR | 20020003015 A | 1/2002 |
| KR | 10-0335501 B1 | 4/2002 |

*Primary Examiner* — Pho M Luu
(74) *Attorney, Agent, or Firm* — Myers Bigel, P.A.

(57) ABSTRACT

A memory module includes a module board including a first and second data vias configured to transmit first and second data, respectively, through first and second data lines arranged adjacent to each other external to the module board, a plurality of layers including the first and second data vias passing therethrough, and a plurality of semiconductor memory devices arranged on at least one outer surface of the module board. The plurality of layers include first and second layers adjacent to each other. The module board includes a first data via wing extending from the first data via toward the second data via and not connected to the second data via in the first layer, and a seventh data via wing extending from the second data via toward the first data via and not connected to the first data via to overlap the first data via wing in the second layer.

26 Claims, 11 Drawing Sheets

(56) References Cited

U.S. PATENT DOCUMENTS

| | | | |
|---|---|---|---|
| 6,772,262 B1 | 8/2004 | Park et al. | |
| 6,990,543 B2 | 1/2006 | Park et al. | |
| 7,035,082 B2 | 4/2006 | Jow et al. | |
| 7,716,401 B2 * | 5/2010 | Lee | G11C 5/00 |
| | | | 326/30 |
| 8,107,254 B2 | 1/2012 | Bandholz et al. | |
| 8,588,017 B2 * | 11/2013 | Park | G11C 11/40618 |
| | | | 365/200 |
| 9,058,897 B2 * | 6/2015 | Yu | G11C 11/4063 |
| 9,240,621 B2 | 1/2016 | Abbott et al. | |
| 9,491,860 B2 | 11/2016 | Akahoshi | |
| 9,520,160 B2 * | 12/2016 | Yoon | G11C 7/109 |
| 9,606,907 B2 * | 3/2017 | Lee | G11C 5/025 |
| 2004/0260859 A1 | 12/2004 | Park et al. | |
| 2014/0301125 A1 | 10/2014 | Yoon et al. | |
| 2017/0004923 A1 | 1/2017 | Chen et al. | |

* cited by examiner

MEMORY MODULE, MEMORY SYSTEM HAVING THE SAME AND ARRANGEMENT METHOD OF A BOARD

CROSS-REFERENCE TO RELATED APPLICATION

This U.S. non-provisional patent application claims priority under 35 U.S.C. § 119 to and the benefit of Korean Patent Application No. 10-2018-0020372, filed on Feb. 21, 2018, in the Korean Intellectual Property Office (KIPO), the disclosure of which is incorporated herein by reference in its entirety.

FIELD

The present inventive concepts relate to memory modules and memory systems having the same.

BACKGROUND

A memory system may include a controller and a memory module arranged on a main board. The controller and the memory module may receive and transmit data through data lines arranged adjacent to each other on the main board. A data transmission speed of a case in which identical pieces of data are transmitted through the data lines arranged adjacent to each other (in an even mode) may be decreased more than that of a case in which different pieces of data are transmitted through the data lines (in an odd mode). Accordingly, a data transmission speed difference may occur between the data transmitted through the data lines, and thus signal integrity may be degraded.

SUMMARY

The present inventive concepts are directed to providing memory modules and memory systems capable of decreasing a data transmission speed difference between data transmitted through external data lines.

The scope of the present inventive concepts is not limited to the above-described objects, and other unmentioned objects may be clearly understood by those skilled in the art from the following descriptions.

A memory module according to some example embodiments of the present inventive concepts includes: a module board including a first data via configured to transmit first data, a second data via configured to transmit second data, and a plurality of layers, each including the first and second data vias; and a plurality of semiconductor memory devices arranged on at least one outer surface of the module board, wherein the first data and the second data are transmitted through first and second data lines arranged adjacent to each other in the outside or externally, the first and second data vias pass through the plurality of layers, the plurality of layers include first and second layers arranged adjacent to each other, and the module board includes a first data via wing extending from the first data via to the second data via and not connected to the second data via, in the first layer, and a seventh data via wing extending from the second data via to the first data via and not connected to the first data via, and to overlap the first data via wing, in the second layer.

A memory system according to some example embodiments of the present inventive concepts includes a controller; a memory module; and a main board including first and second data lines connecting the controller and the memory module and configured to transmit first and second data, wherein the memory module includes a module board including a first data via configured to transmit the first data, a second data via configured to transmit the second data, and a plurality of layers, each including the first data via and the second data via, and a plurality of semiconductor memory devices arranged on at least one outer side of the module board, and the first and second data vias pass through the plurality of layers, the plurality of layers includes first and second layers arranged adjacent to each other, and the module board includes a first data via wing extending from the first data via to the second data via and not connected to the second data via, in the first layer, and a seventh data via wing extending from the second data via to the first data via and not connected to the first data via, and to overlap the first data via wing, in the second layer.

DETAILED DESCRIPTION

Hereinafter, a memory module and a memory system having the same according to exemplary embodiments of the present inventive concepts will be described with reference to the accompanying drawings.

Figure 1:
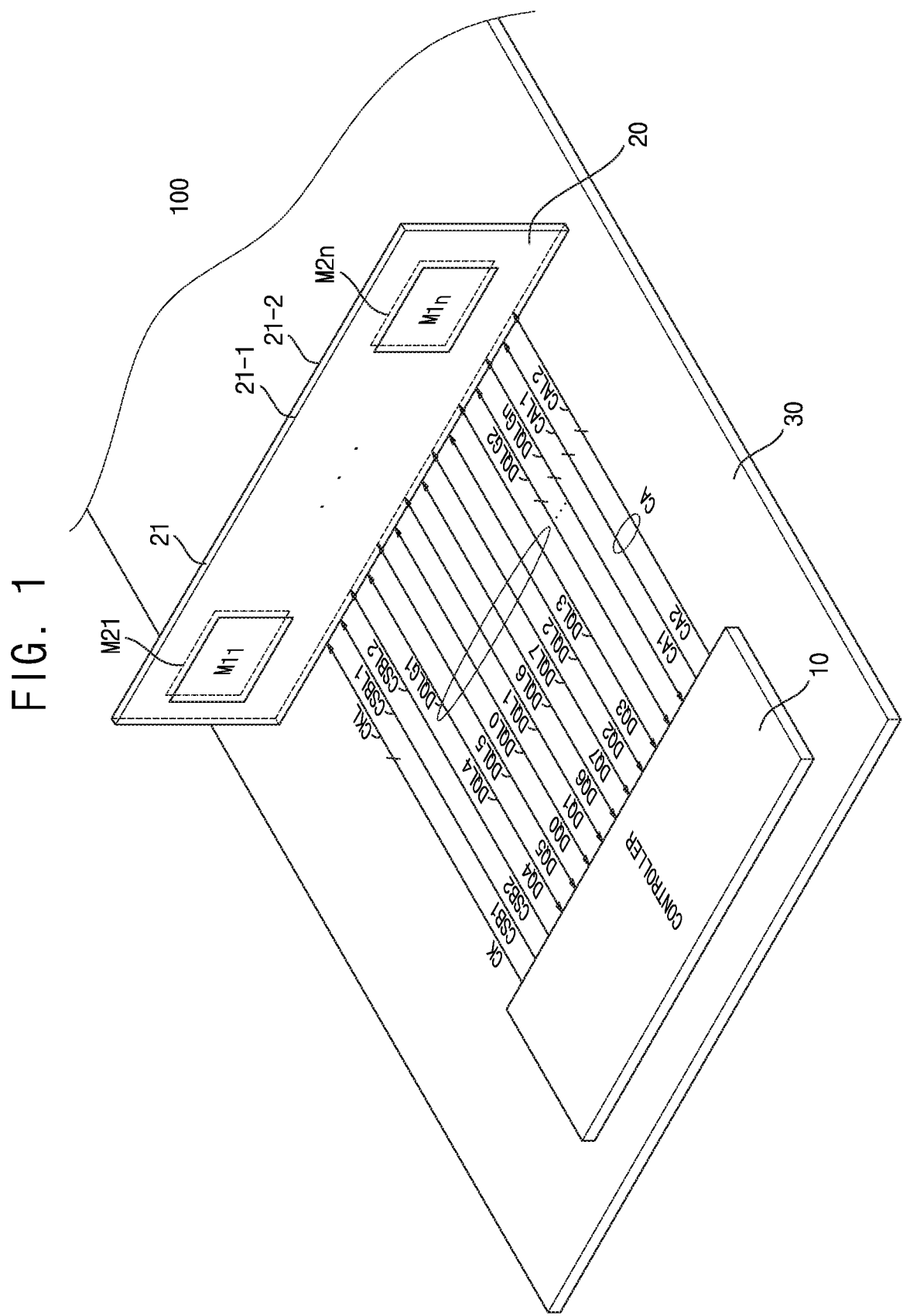
FIG. 1 is a diagram illustrating a configuration of a memory system according to some example embodiments of the present inventive concepts.

FIG. 1 is a diagram illustrating a configuration of a memory system according to some example embodiments of the present inventive concepts. A memory system 100 may include a controller 10 and a memory module 20. The memory module 20 may include a module board 21, semiconductor memory devices M11 to M1n arranged on an upper surface 21-1 of the module board 21, and semiconductor memory devices M21 to M2n arranged on a lower surface 21-2 of the module board 21. Spatially relative terms, such as "beneath," "below," "lower," "above," "upper" "higher," and the like, are intended to encompass different orientations of the device in use or operation in addition to the orientation depicted in the figures. As an alternative to FIG. 1, the semiconductor memory devices M11 to M1n and M21 to M2n may be arranged on one of the upper surface 21-1 and the lower surface 21-2, respectively.

Further, the memory system 100 may include a main board 30 in which a clock signal line CKL, a first inverted chip selection signal line CSBL1, first, third, fifth, and seventh data lines DQL4, DQL0, DQL6, and DQL2, and a first command and address line CAL1 connect the controller 10 and the upper surface 21-1 of the module board 21 of the memory module 20, and a second inverted chip selection signal line CSBL2, second, fourth, sixth, and eighth data lines DQL5, DQL1, DQL7, and DQL3, and a second command and address line CAL2 connect the controller 10 and the lower surface 21-2 of the module board 21 of the memory module 20. As used herein, the terms first, second, third, etc. are used merely to differentiate one element (e.g., line, via, etc.) from another. The clock signal line CKL may transmit a clock signal CK transmitted from the controller 10 to the memory module 20. The first inverted chip selection signal line CSBL1 may transmit a first inverted chip selection signal CSB1 transmitted from the controller 10 to the semiconductor memory devices M11 to M1n. The second inverted chip selection signal line CSBL2 may transmit a second inverted chip selection signal CSB2 transmitted from the controller 10 to the semiconductor memory devices M21 to M2n. The first to eighth data lines DQL4, DQL5, DQL0, DQL1, DQL6, DQL7, DQL2, and DQL3 may transmit first to eighth data DQ4, DQ5, DQ0, DQ1, DQ6, DQ7, DQ2, and DQ3, between the controller 10 and the semiconductor memory device M11 or M21. The first to eighth data lines DQL4, DQL5, DQL0, DQL1, DQL6, DQL7, DQL2, and DQL3 may be arranged adjacent to each other. When an element or layer is referred to herein as being "on" or "adjacent" or "coupled to" another element or layer, intervening elements or layers may be present. In contrast, the terms "directly on" or "directly adjacent" or "directly coupled" may mean that there are no intervening elements or layers present. The first to eighth data lines DQL4, DQL5, DQL0, DQL1, DQL6, DQL7, DQL2, and DQL3 may be a first data line group DQLG1. Each of second to $n^{th}$ data line groups DQLG2 to DQLGn may include eight data lines like the first data line group DQLG1, and the eight data lines may be arranged like the first data line group DQLG1. The second data line group DQLG2 may transmit data between the controller 10 and the semiconductor memory device M12 or M22, and the $n^{th}$ data line group DQLGn may transmit data between the controller 10 and the semiconductor memory device M1n or M2n. That is, each data line group may transmit data between the controller 10 and a corresponding semiconductor memory device. The first command and address lines CAL1 and the second command and address lines CAL2 may transmit a first command and address CA1 which is a portion of a command and address CA transmitted from the controller 10, and a second command and address CA2 which is the remaining portion of the command and address CA except for or other than the first command and address CA1. The first and second command and addresses CA1 and CA2 transmitted through the first and second command and address lines CAL1 and CAL2 may be transmitted to the semiconductor memory devices M11 to M1n and M21 to M2n, respectively. The memory module 20 may be an unbuffered dual in-line memory module (UDIMM), a fully buffered DIMM (FBDIMM), a small outline DIMM (SODIMM), or a registered DIMM (RDIMM).

Figure 2A:
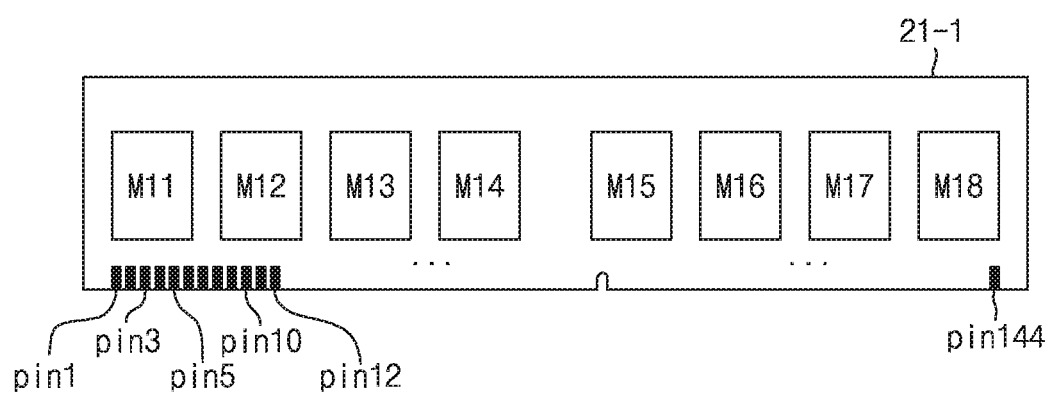
FIGS. 2A and 2B are diagrams illustrating arrangements of an upper surface and a lower surface of a memory module according to some example embodiments of the present inventive concepts.
Figure 2B:
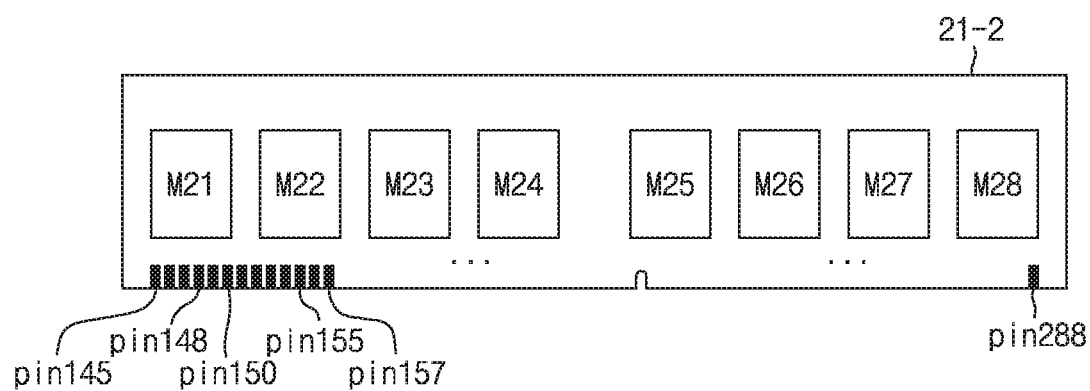

FIGS. 2A and 2B are diagrams illustrating arrangements of the upper surface 21-1 and the lower surface 21-2 of the module board 21 of the memory module 20 according to some example embodiments of the present inventive concepts, respectively. FIGS. 2A and 2B illustrate the arrangements of the upper surface 21-1 and the lower surface 21-2 of the module board 21 of the memory module 20 when the memory module 20 is a 288-pin double data rate 4 (DDR4) UDIMM.

Referring to FIGS. 1 and 2A, eight semiconductor memory devices M11, M12, M13, M14, M15, M16, M17, M18 may be arranged on the upper surface 21-1 of the module board 21 of the memory module 20, and 144 pins (terminals) may be arranged on one end of the upper surface 21-1. First pin pin1 to $144^{th}$ pin pin144 may be arranged from a left side to a right side of one end of the upper surface 21-1, and a third pin pin3, a fifth pin pin5, a tenth pin pin10, and a twelfth pin pin12 may be respectively connected to the first, the third, the fifth, and the seventh data lines DQL4, DQL0, DQL6, and DQL2 of the main board 30.

Referring to FIG. 2B, eight semiconductor memory devices M21, M22, M23, M24, M25, M26, M27, M28 may be arranged on the lower surface 21-2 of the module board 21 of the memory module 20, and 144 pins (terminals) may be arranged on one end of the lower surface 21-2. $145^{th}$ pin pin145 to $288^{th}$ pin pin288 may be arranged from a left side to a right side of one end of the lower surface 21-2, and a $148^{th}$ pin pin148, a $150^{th}$ pin pin150, a $155^{th}$ pin pin155, and a $157^{th}$ pin pin157 may be respectively connected to the second, the fourth, the sixth, and the eighth data lines DQL5, DQL1, DQL7, and DQL3 of the main board 30.

Other signal pins or power pins may be arranged between the data pins shown in FIGS. 2A and 2B. The pin assignments shown in FIGS. 2A and 2B are pin assignments of the 288-pin DDR4 UDIMM standardized by Joint Electron Device Engineering Council (JEDEC).

Figure 3:
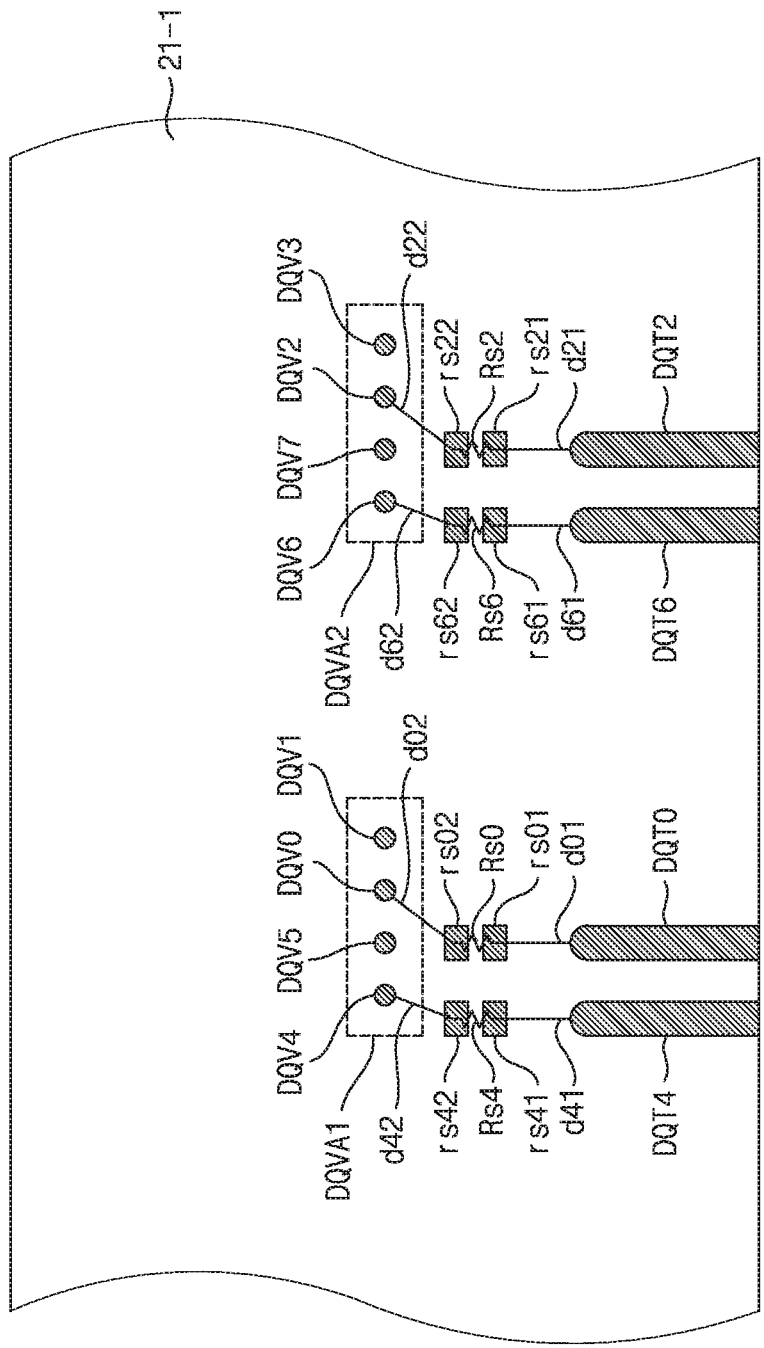
FIG. 3 is a diagram illustrating arrangements of terminals, lines, and vias of an upper surface of a module board of a memory module according to some example embodiments of the present inventive concepts.

FIG. 3 is a diagram illustrating arrangements of the upper surface 21-1 of the module board 21 of the memory module 20 according to some example embodiments of the present inventive concepts. First to eighth lines d41, d42, d01, d02, d61, d62, d21, and d22, first, third, fifth, and seventh data terminals DQT4, DQT0, DQT6, and DQT2, first to eighth resistor terminals rs41, rs42, rs01, rs02, rs61, rs62, rs21, and rs22, and first to eighth data vias DQV4, DQV5, DQV0, DQV1, DQV6, DQV7, DQV2, and DQV3 may be arranged in the upper surface 21-1 of the module board 21 of the memory module 20 (for example, when the module board 21 includes j layers, an upper surface of a first layer). Further, first to fourth resistors Rs4, Rs0, Rs6, and Rs2 may connect the first and the second resistor terminals rs41 and rs42, connect the third and the fourth resistor terminals rs01 and rs02, connect the fifth and the sixth resistor terminals rs61 and rs62, and connect the seventh and the eighth resistor terminals rs21 and rs22, respectively.

In FIG. 3, the arrangements of the first, the third, the fifth, and the seventh data terminals DQT4, DQT0, DQT6, and DQT2 of the upper surface 21-1 of the module board 21 of the memory module 20 may have the arrangements standardized by JEDEC as shown in FIG. 2. Although not shown, ground voltage terminals may be arranged between the first and the third data terminals DQT4 and DQT0 and between the fifth and the seventh data terminals DQT6 and DQT2 of the upper surface 21-1 of the module board 21 of the memory module 20, and other signal or power terminals may be arranged between the third and the fifth data terminals DQT0 and DQT6.

Referring to FIGS. 1, 2A, and 3, the first, the third, the fifth, and the seventh data lines DQL4, DQL0, DQL6, and DQL2 may be connected to respective ends of the first, the third, the fifth, and the seventh data terminals DQT4, DQT0, DQT6, and DQT2, respectively. Respective ends of the first, third, fifth, and seventh lines d41, d01, d61, and d21 may be connected to the other ends of the first, the third, the fifth, and the seventh data terminals DQT4, DQT0, DQT6, and DQT2, respectively. The first, the third, the fifth, and the seventh resistor terminals rs41, rs01, rs61, and rs21 may be connected to the other ends of the first, the third, the fifth, and the seventh lines d41, d01, d61, and d21, respectively. The second, the fourth, the sixth, and the eighth resistor terminals rs42, rs02, rs62, and rs22 may be arranged at positions spaced apart from the first, the third, the fifth, and the seventh resistor terminals rs41, rs01, rs61, and rs21, respectively. The first to fourth resistors Rs4, Rs0, Rs6, and Rs2 for impedance matching may be arranged between the first and second resistor terminals rs41 and rs42, between the third and fourth resistor terminals rs01 and rs02, between the fifth and sixth resistor terminals rs61 and rs62, and between the seventh and eighth resistor terminals rs21 and rs22, respectively. The first to fourth data vias DQV4, DQV5, DQV0, and DQV1 may be horizontally arranged in a line (i.e., in a collinear arrangement) in a first data via region DQVA1 at a position spaced apart from the second and fourth resistor terminals rs42 and rs02. The second resistor terminal rs42 and the first data via DQV4 may be connected by the second line d42, and the fourth resistor terminal rs02 and the third data via DQV0 may be connected by the fourth line d02. Similarly, the fifth to eighth data vias DQV6, DQV7, DQV2, and DQV3 may be horizontally arranged in a line in a second data via region DQVA2 at a position spaced apart from the sixth and eighth resistor terminals rs62 and rs22. The sixth resistor terminal rs62 and the fifth data via DQV6 may be connected by the sixth line d62, and the eighth resistor terminal rs22 and the seventh data via DQV2 may be connected by the eighth line d22.

Figure 4:
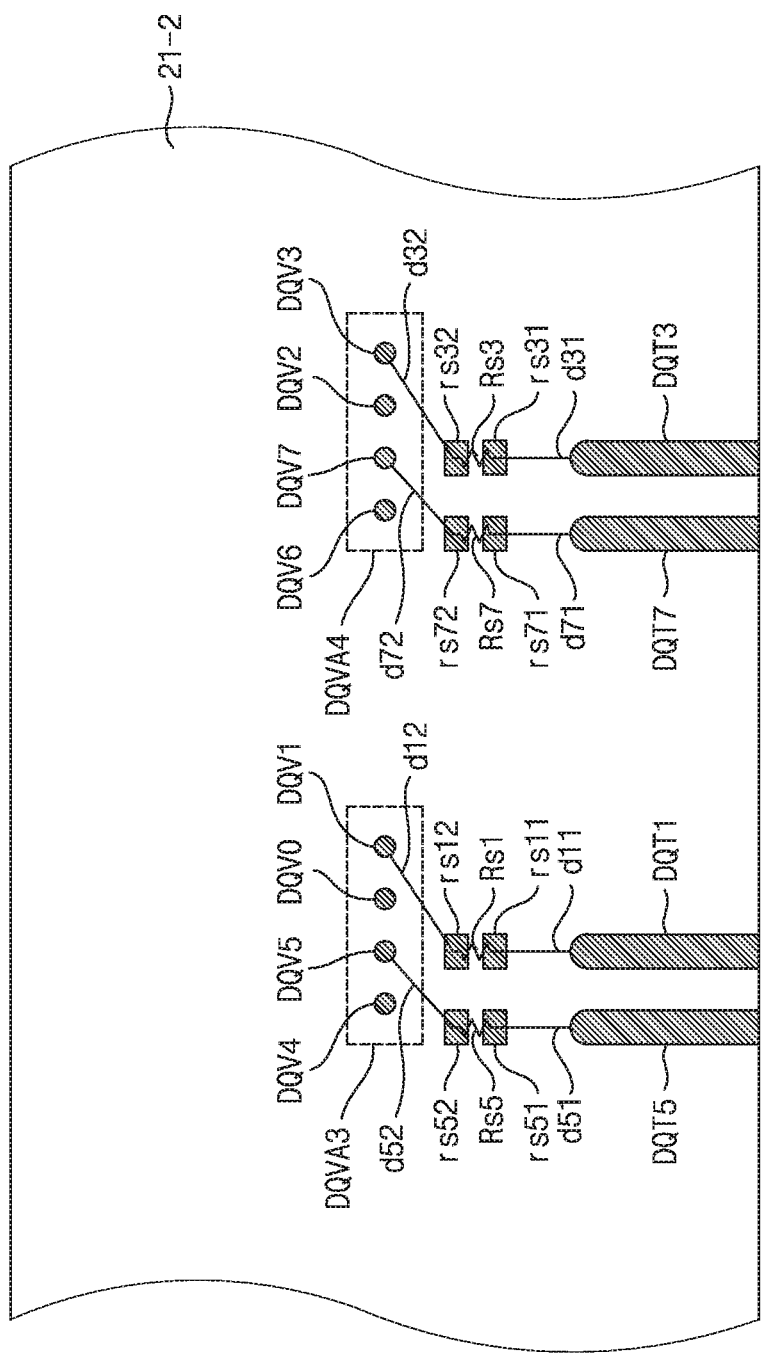
FIG. 4 is a diagram illustrating arrangements of terminals, lines, and vias of a lower surface of a module board of a memory module according to some example embodiments of the present inventive concepts.

FIG. 4 is a diagram illustrating arrangements of the lower surface 21-2 of the module board 21 of the memory module 20 according to some example embodiments of the present inventive concepts. Second, fourth, sixth, and eighth data terminals DQT5, DQT1, DQT7, and DQT3, ninth to sixteenth lines d51, d52, d11, d12, d71, d72, d31, and d32, ninth to sixteenth resistor terminals rs51, rs52, rs11, rs12, rs71, rs72, rs31, and rs32, fifth to eighth resistors Rs5, Rs1, Rs7, and Rs3, and first to eighth data vias DQV4, DQV5, DQV0, DQV1, DQV6, DQV7, DQV2, and DQV3 may be arranged in the lower surface 21-2 of the module board 21 of the memory module 20 (for example, when the module board 21 includes j layers, a lower surface of a $j^{th}$ layer).

In FIG. 4, the arrangements of the second, the fourth, the sixth, and the eighth data terminals DQT5, DQT1, DQT7, and DQT3 of the lower surface 21-2 of the module board 21 of the memory module 20 may have the arrangements standardized by JEDEC as shown in FIG. 2B. Although not shown, ground voltage terminals may be arranged between the second and fourth data terminals DQT5 and DQT1 and between the sixth and eighth data terminals DQT7 and DQT3 of the lower surface 21-2 of the module board 21 of the memory module 20, and other signal or power terminals may be arranged between the fourth and sixth data terminals DQT1 and DQT7.

Referring to FIGS. 1, 2B, and 4, the second, the fourth, the sixth, and the eighth data lines DQL5, DQL1, DQL7, and DQL3 may be connected to respective ends of the second, the fourth, the sixth, and the eighth data terminals DQT5, DQT1, DQT7, and DQT3, respectively, and the ninth, the eleventh, the thirteenth, and the fifteenth lines d51, d11, d71, and d31 may be connected to the other ends of the second, the fourth, the sixth, and the eighth data terminals DQT5, DQT1, DQT7, and DQT3, respectively. The ninth, the eleventh, the thirteenth, and the fifteenth resistor terminals rs51, rs11, rs71, and rs31 may be connected to the other ends of the ninth, the eleventh, the thirteenth, and the fifteenth lines d51, d11, d71, and d31, respectively. The tenth, the twelfth, the fourteenth, and the sixteenth resistor terminals rs52, rs12, rs72, and rs32 may be arranged at positions spaced apart from the ninth, the eleventh, the thirteenth, and the fifteenth resistor terminals rs51, rs11, rs71, and rs31, respectively. The fifth, the sixth, the seventh, and the eighth resistors Rs5, Rs1, Rs7, and Rs3 for impedance matching may be arranged between the ninth and tenth resistor terminals rs51 and rs52, between the eleventh and twelfth resistor terminals rs11 and rs12, between the thirteenth and fourteenth resistor terminals rs71 and rs72, and between the fifteenth and sixteenth resistor terminals rs31 and rs32, respectively. The first, the second, the third, and the fourth data vias DQV4, DQV5, DQV0, and DQV1 may be horizontally arranged in a line in a third data via region DQVA3 at a position spaced apart from the tenth and twelfth resistor terminals rs52 and rs12. The tenth resistor terminal rs52 and the second data via DQV5 may be connected by the tenth line d52, and the twelfth resistor terminal rs12 and the fourth data via DQV1 may be connected by the twelfth line d12. Similarly, the fifth, the sixth, the seventh, and the eighth data vias DQV6, DQV7, DQV2, and DQV3 may be horizontally arranged in a line in a fourth data via region DQVA4 at a position spaced apart from the fourteenth and sixteenth resistor terminals rs72 and rs32. The fourteenth resistor terminal rs72 and the sixth data via DQV7 may be connected by the fourteenth line d72, and the sixteenth resistor terminal rs32 and the eighth data via DQV3 may be connected by the sixteenth line d32.

Referring to FIGS. 3 and 4, the first, the third, the fifth, and the seventh data terminals DQT4, DQT0, DQT6, and DQT2, the first, the third, the fifth, and the seventh resistor terminals rs41, rs01, rs61, and rs21, the second, the fourth, the sixth, and the eighth resistor terminals rs42, rs02, rs62, and rs22, and the first to eighth data vias DQV4, DQV5, DQV0, DQV1, DQV6, DQV7, DQV2, and DQV3 arranged in the upper surface 21-1 of the module board 21 may be arranged at positions corresponding to the second, the fourth, the sixth, and the eighth data terminals DQT5, DQT1, DQT7, and DQT3, the ninth, the eleventh, the thirteenth, and the fifteenth resistor terminals rs51, rs11, rs71, and rs31, the tenth, the twelfth, the fourteenth, the sixteenth resistor terminals rs52, rs12, rs72, and rs32, and the first to eighth data vias DQV4, DQV5, DQV0, DQV1, DQV6, DQV7, DQV2, and DQV3 arranged in the lower surface 21-2 of the module board 21.

Figure 5:
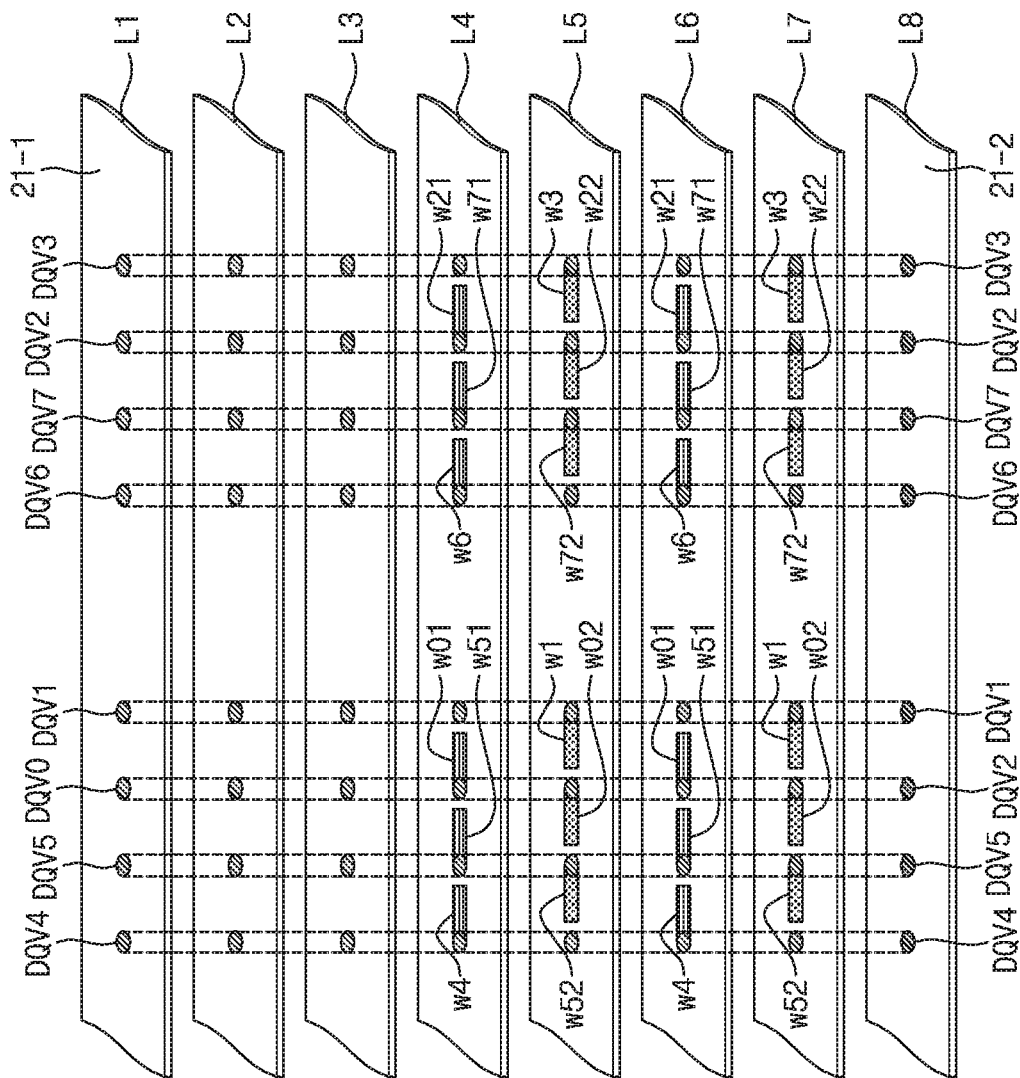
FIG. 5 is a diagram illustrating arrangements of data vias of a module board of a memory module according to some example embodiments of the present inventive concepts.

FIG. 5 is a diagram illustrating arrangements of the data vias of the module board 21 of the memory module 20 according to some example embodiments of the present inventive concepts. The module board 21 may include eight layers L1 to L8.

Referring to FIG. 5, an upper surface of a first layer L1 may have the arrangements of the upper surface 21-1 shown in FIG. 3, and a lower surface of an eighth layer L8 may have the arrangements of the lower surface 21-2 shown in FIG. 4. The module board 21 may include the first to eighth data vias DQV4, DQV5, DQV0, DQV1, DQV6, DQV7, DQV2, and DQV3 formed in each of the first to eighth layers L1 to L8. The first to eighth data vias DQV4, DQV5, DQV0, DQV1, DQV6, DQV7, DQV2, and DQV3 formed at an identical position of each layer may be filled with conductive materials, and thus the first data vias DQV4, the second data vias DQV5, the third data vias DQV0, the fourth data vias DQV1, the fifth data vias DQV6, the sixth data vias DQV7, the seventh data vias DQV2, and the eighth data vias DQV3 formed in the first to eighth layers L1 to L8 may be connected to each other, respectively. Each of the eight layers L1 to L8 may be an insulating layer. Further, each of first, second, and third data via wings w4, w51, and w01 which extends from each of the first, the second, and the third data vias DQV4, DQV5, and DQV0 arranged in the fourth layer L4 to one of the second, the third, and the fourth data vias DQV5, DQV0, and DQV1 arranged adjacent thereto, and is not connected to the one of the second, the third, and the fourth data vias DQV5, DQV0, and DQV1 arranged adjacent thereto, and each of fourth, fifth, and sixth data via wings w6, w71, and w21 which extends from each of the fifth, the sixth, and the seventh data vias DQV6, DQV7, and DQV2 to one of the sixth, the seventh, and the eighth data vias DQV7, DQV2, and DQV3 arranged adjacent thereto, and is not connected to the one of the sixth, the seventh, and the eighth data vias DQV7, DQV2, and DQV3 arranged adjacent thereto may be arranged in an upper surface (or a lower surface) of the fourth layer L4. Each of the first to sixth data via wings w4, w51, w01, w6, w71, and w21 may be a conductive plate. Each of seventh, eighth, and ninth data via wings w52, w02, and w1 which extends from each of the second, the third, and the fourth data vias DQV5, DQV0, and DQV1 formed in the fifth layer L5 adjacent to the fourth layer L4 to one of the first, the second, and the third data vias DQV4, DQV5, and DQV0 arranged adjacent thereto, and is not connected to the one of the first, the second, and the third data vias DQV4, DQV5, and DQV0 arranged adjacent thereto, and each of tenth, eleventh, and twelfth data via wings w72, w22, and w3 which extends from each of the sixth, the seventh, and the eighth data vias DQV7, DQV2, and DQV3 to one of the fifth, the sixth, and the seventh data vias DQV6, DQV7, and DQV2 arranged adjacent thereto, and is not connected to the one of the fifth, the sixth, and the seventh data vias DQV6, DQV7, and DQV2 arranged adjacent thereto may be arranged in an upper surface (or, a lower surface) of the fifth layer L5. Each of the seventh to twelfth data via wings w52, w02, w1, w72, w22, and w3 may be a conductive plate.

The first to sixth data via wings w4, w51, w01, w6, w71, and w21 arranged in the upper surface (or, the lower surface) of the fourth layer L4 and the seventh to twelfth data via wings w52, w02, w1, w72, w22, and w3 arranged in the upper surface (or the lower surface) of the fifth layer L5 may be arranged to overlap each other in plan view. The two data via wings w4 and w52, w51 and w02, w01 and w1, w6 and w72, w71 and w22, or w21 and w3 which are arranged to overlap each other may be conductive plates, and an insulating layer may be arranged therebetween, and thus a first coupling capacitors may be formed. The pairs of data via wings on the different layers (e.g., layers L4 and L5) defining the coupling capacitors may be vertically aligned at edges thereof and may be of similar lengths/dimensions such that a majority of the conductive plates of each pair of data via wings may overlap with each other in plan view. For example, the first data via wing w4 and the seventh data via wing w52 may have similar lengths and similar widths in respective directions parallel to the upper and lower surfaces 21-1 and 21-2 to increase the amount of overlap (and thus the effective coupling capacitance) therebetween. In some embodiments, at least one dimension of the pair of data via wings on the different layers defining the coupling capacitors may be identical (e.g., the first data via wing w4 and seventh data via wing w52 may have the same widths and/or lengths) such that the data via wings of each pair do not extend beyond one another in the at least one dimension.

A data transmission speed of a case in which two pieces of data having different levels (e.g., logic 0 and logic 1) are transmitted between adjacent two data lines DQL4 and DQL5, DQL5 and DQL0, DQL0 and DQL1, DQL6 and DQL7, DQL7 and DQL2, or DQL2 and DQL3 of the main board 30 shown in FIG. 1 (in an odd mode) may be greater than that of a case in which two pieces of data having the same level (e.g., logic 1 and logic 1, or logic 0 and logic 0) are transmitted between the adjacent two data lines DQL4 and DQL5, DQL5 and DQL0, DQL0 and DQL1, DQL6 and DQL7, DQL7 and DQL2, or DQL2 and DQL3 (in an even mode). In this case, the first coupling capacitors formed between the two data via wings w4 and w52, w51 and w02, w01 and w1, w6 and w72, w71 and w22, or w21 and w3 arranged to overlap each other may delay the data transmission speed when the two pieces of data having different levels are transmitted through the adjacent two data lines DQL4 and DQL5, DQL5 and DQL0, DQL0 and DQL1, DQL6 and DQL7, DQL7 and DQL2, or DQL2 and DQL3 of the main board 30 (in the odd mode), and thus a data transmission speed difference between the case in which the two pieces of data having different levels are transmitted (the odd mode) and the case in which the two pieces of data having the same level are transmitted (the even mode) may be decreased. Accordingly, signal integrity may be improved.

First to sixth data via wings w4, w51, w01, w6, w71, and w21 which are identical to the first to sixth data via wings w4, w51, w01, w6, w71, and w21 arranged in the upper surface (or the lower surface) of the fourth layer L4 may be further arranged in an upper surface (or a lower surface) of the sixth layer L6, and seventh to twelfth data via wings w52, w02, w1, w72, w22, and w3 which are identical to the seventh to twelfth data via wings w52, w02, w1, w72, w22, and w3 arranged in the upper surface (or the lower surface) of the fifth layer L5 may be further arranged in an upper surface (or a lower surface) of the seventh layer L7. Accordingly, the two data via wings w4 and w52, w51 and w02, w01 and w1, w6 and w72, w71 and w22, or w21 and w3 which are arranged to overlap each other in the sixth layer L6 and the seventh layer L7 may be conductive plates, and an insulating layer may be arranged therebetween, and thus second coupling capacitors may be formed. Further, the second coupling capacitors formed between the two data via wings w4 and w52, w51 and w02, w01 and w1, w6 and w72, w71 and w22, or w21 and w3 which are arranged to overlap each other in the sixth layer L6 and the seventh layer L7 may be connected in parallel to the first coupling capacitors formed between the two data via wings w4 and w52, w51 and w02, w01 and w1, w6 and w72, w71 and w22, or w21 and w3 which are arranged to overlap each other in the fourth layer L4 and the fifth layer L5. The first coupling capacitors and the second coupling capacitors may perform an operation (delay the data transmission speed) when the two pieces of data having different levels are transmitted through the data via wings arranged in both ends, and may not perform the operation (not delay the data transmission speed) when the two pieces of data having the same level is transmitted.

When the two pieces of data having different levels are transmitted through the adjacent two data lines DQL4 and DQL5, DQL5 and DQL0, DQL0 and DQL1, DQL1 and DQL6), DQL6 and DQL7, DQL7 and DQL2, or DQL2 and DQL3 of the main board 30 (in the odd mode), the data transmission speed may be further delayed by further configuring (or connecting in parallel) the second coupling capacitors to the first coupling capacitors, and thus the data transmission speed difference between the case in which the two pieces of data having different levels are transmitted (the odd mode) and the case in which the two pieces of data having the same level are transmitted (the even mode) may be further decreased. Accordingly, signal integrity may be improved.

Figure 6:
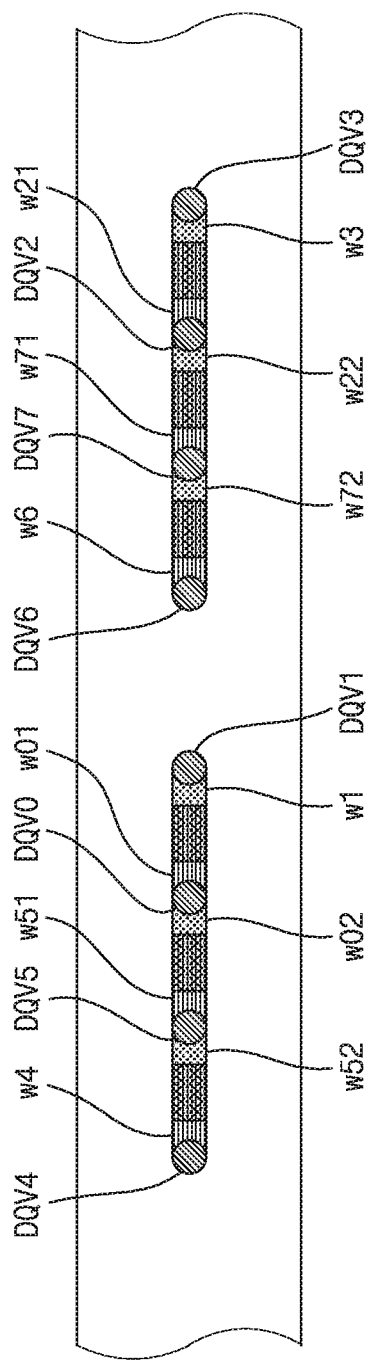
FIG. 6 is a plan view of the upper surface of the module board of the memory module shown in FIG. 5.

FIG. 6 is a plan view of the upper surface 21-1 of the module board 21 of the memory module 20 shown in FIG. 5. The first to sixth data via wings w4, w51, w01, w6, w71, and w21 may be arranged to overlap the seventh to twelfth data via wings w52, w02, w1, w72, w22, and w3, respectively. Further, as described above, the first to third data via wings w4, w51, and w01 may be arranged in a line, the fourth to sixth data via wings w6, w71, and w21 may be arranged in a line, the seventh to ninth data via wings w52, w02, and w1 may be arranged in a line, and the tenth to twelfth data via wings w72, w22, and w3 may also be arranged in a line.

Figure 7:
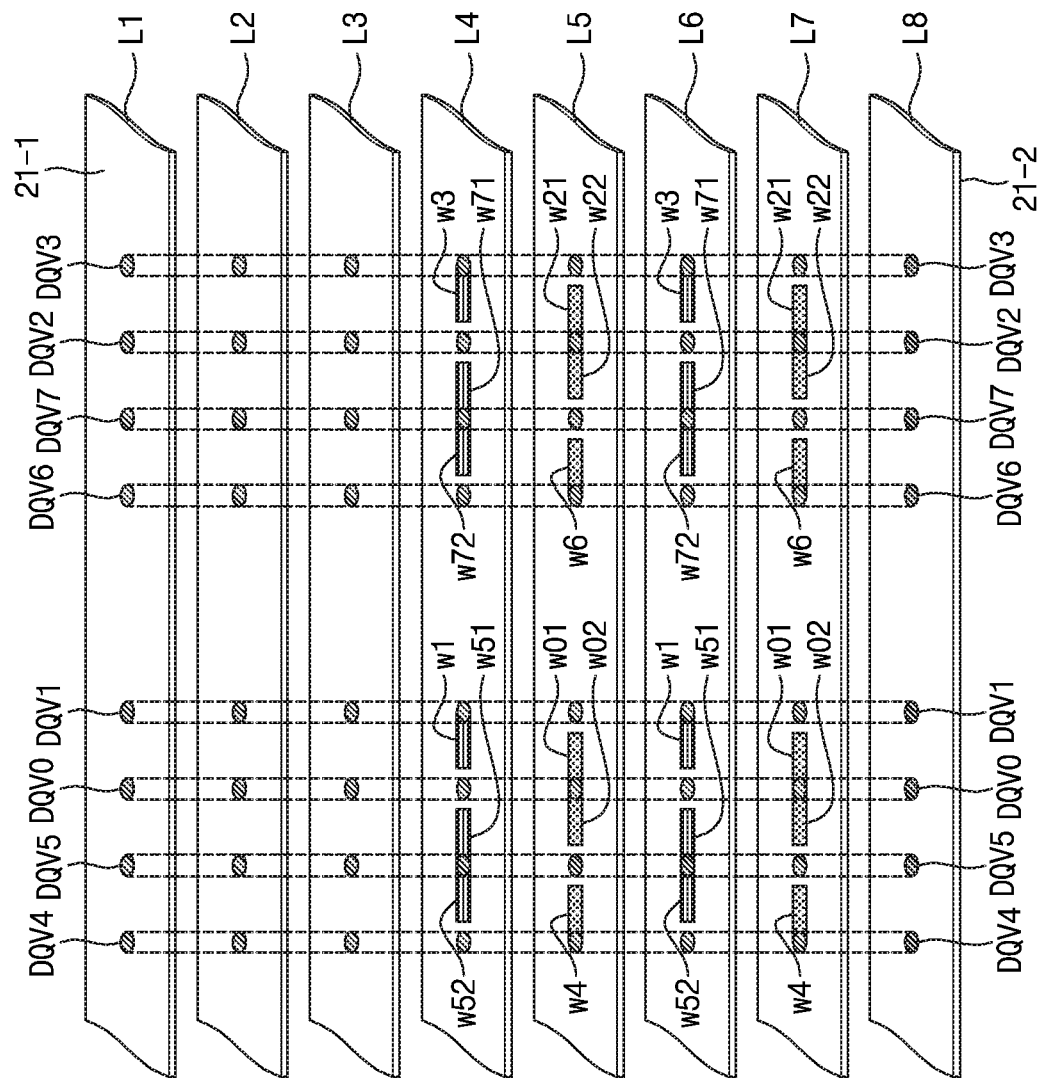
FIG. 7 is a diagram illustrating arrangements of data vias of a module board of a memory module according to some example embodiments of the present inventive concepts.

FIG. 7 is a diagram illustrating arrangements of data vias of the module board 21 of the memory module 20 according to some example embodiments of the present inventive concepts. The data vias shown in FIG. 7 may have the same arrangements as those of the first to eighth data vias DQV4, DQV5, DQV0, DQV1, DQV6, DQV7, DQV2, and DQV3 shown in FIG. 5. Further, second, fifth, eighth, and eleventh data via wings may have the same arrangements as those of the second, the fifth, the eighth, and the eleventh data via wings w51, w71, w02, and w22 shown in FIG. 5. However, as an alternative to FIG. 5, first, third, fourth, and sixth data via wings w4, w01, w6, and w21 may be arranged in the fifth layer L5 and the seventh layer L7 instead of the fourth layer L4 and the sixth layer L6, and seventh, ninth, tenth, and twelfth data via wings w52, w1, w72, and w3 may be arranged in the fourth layer L4 and the sixth layer L6 instead of the fifth layer L5 and the seventh layer L7. In this case, the seventh and second data via wings w52 and w51 may be integrally formed, the eighth and third data via wings w02 and w01 may be integrally formed, the tenth and fifth data via wings w72 and w71 may be integrally formed, and the eleventh and sixth data via wings w22 and w21 may be integrally formed.

Figure 8:
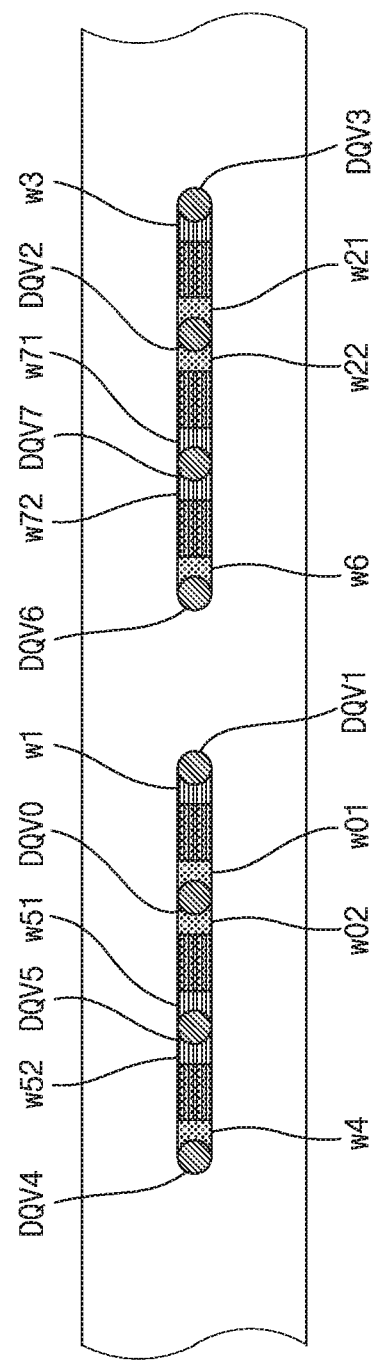
FIG. 8 is a plan view of the upper surface of the module board of the memory module shown in FIG. 7.

FIG. 8 is a plan view of the upper surface 21-1 of the module board 21 of the memory module 20 shown in FIG. 7. The seventh, the second, the ninth, the tenth, the fifth, and the twelfth data via wings w52, w51, w1, w72, w71, and w3 may be arranged to overlap the first, the eighth, the third, the fourth, the eleventh, and the sixth data via wings w4, w02, w01, w6, w22, and w21, respectively. Further, as described above, the seventh, the second, and the ninth data via wings w52, w51, and w1 may be arranged in a line, the tenth, the fifth, and the twelfth data via wings w72, w71, and w3 may be arranged in a line, the first, the eighth, and the third data via wings w4, w02, and w01 may be arranged in a line, and the fourth, the eleventh, and the sixth data via wings w6, w22, and w21 may be arranged in a line.

Figure 9:
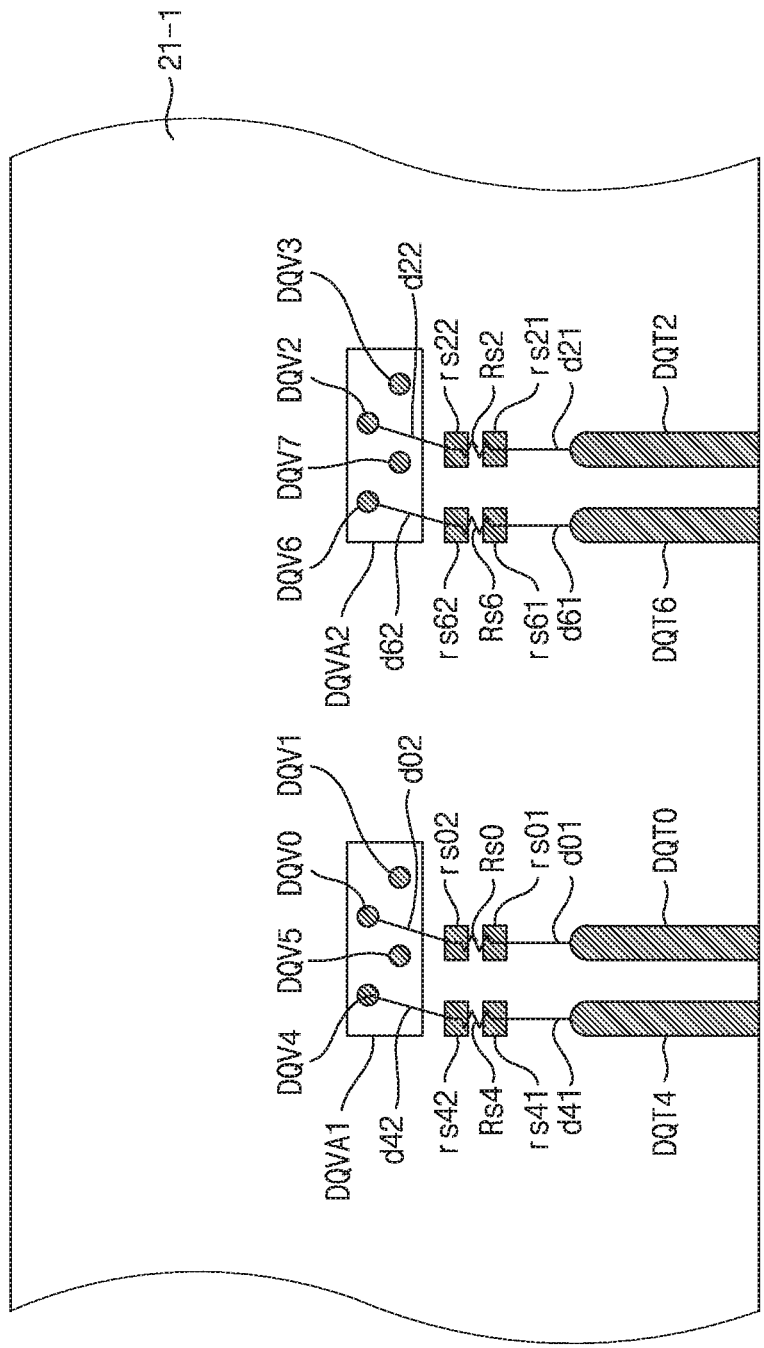
FIG. 9 is a diagram illustrating arrangements of terminals, lines, and vias of an upper surface of a module board of a memory module according to some example embodiments of the present inventive concepts.

FIG. 9 is a diagram illustrating arrangements of the upper surface 21-1 of the module board 21 of the memory module 20 according to some example embodiments of the present inventive concepts. The arrangements shown in FIG. 9 may be similar to the arrangements of the upper surface 21-1 shown in FIG. 3, but as an alternative to the arrangement of the upper surface 21-1 shown in FIG. 3, the first to fourth data vias DQV4, DQV5, DQV0, and DQV1 arranged in the first data via region DQVA1 may be arranged in two rows by two, and the fifth to eighth data vias DQV6, DQV7, DQV2, and DQV3 arranged in the second data via region DQVA2 may be arranged in two rows by two. That is, the first and third data vias DQV4 and DQV0 may be arranged in an upper portion of the first data via region DQVA1, and the second and fourth data vias DQV5 and DQV1 may be arranged in a lower portion of the first data via region DQVA1. The fifth and seventh data vias DQV6 and DQV2 may be arranged in an upper portion of the second data via region DQVA2, and the sixth and eighth data vias DQV7 and DQV3 may be arranged in a lower portion of the second data via region DQVA2.

As an alternative to what is shown in FIG. 9, the first and second data vias DQV4 and DQV5 may be arranged in the upper portion of the first data via region DQVA1, and the third and fourth data vias DQV0 and DQV1 may be arranged in the lower portion of the first data via region DQVA1. Similarly, the fifth and sixth data vias DQV6 and DQV7 may be arranged in the upper portion of the second data via region DQVA2, and the seventh and eighth data vias DQV2 and DQV3 may be arranged in the lower portion of the second data via region DQVA2.

Figure 10:
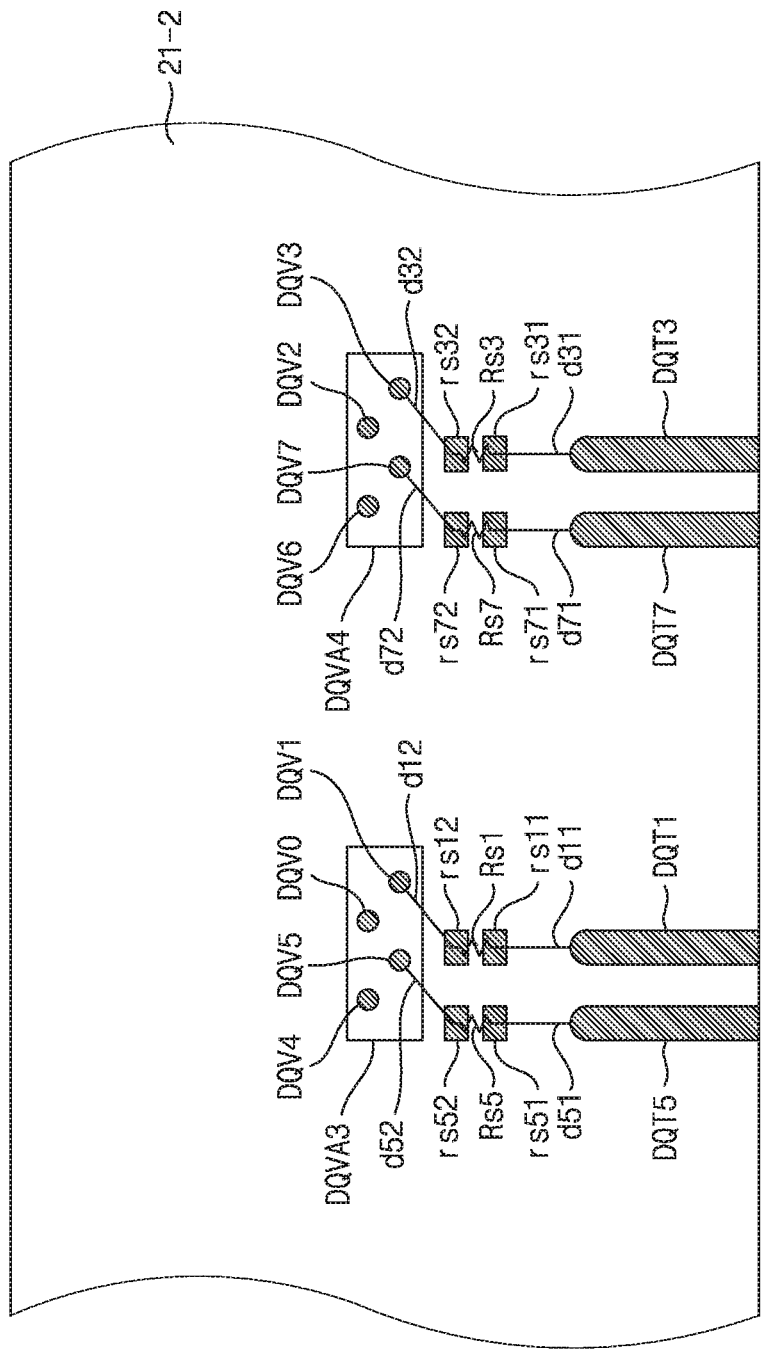
FIG. 10 is a diagram illustrating arrangements of terminals, lines, and vias of a lower surface of a module board of a memory module according to some example embodiments of the present inventive concepts.

FIG. 10 is a diagram illustrating arrangements of the lower surface 21-2 of the module board 21 of the memory module 20 according to some example embodiments of the present inventive concepts. The arrangements shown in FIG. 10 may be similar to the arrangements of the lower surface 21-2 shown in FIG. 4, but the first to fourth data vias DQV4, DQV5, DQV0, and DQV1 arranged in the third data via region DQVA3 and the fifth to eighth data vias DQV6, DQV7, DQV2, and DQV3 arranged in the fourth data via region DQVA4 may have arrangements different from those of FIG. 4. The first to fourth data vias DQV4, DQV5, DQV0, and DQV1 arranged in the third data via region DQVA3 and the fifth to eighth data vias DQV6, DQV7, DQV2, and DQV3 arranged in the fourth data via region DQVA4 may have the same arrangements as the first to fourth data vias DQV4, DQV5, DQV0, and DQV1 arranged in the first data via region DQVA1 and the fifth to eighth data vias DQV6, DQV7, DQV2, and DQV3 arranged in the second data via region DQVA2 shown in FIG. 9.

As an alternative to what is shown in FIG. 10, the first and second data vias DQV4 and DQV5 may be arranged in the upper portion of the third data via region DQVA3, and the third and fourth data vias DQV0 and DQV1 may be arranged in the lower portion of the third data via region DQVA3. Similarly, the fifth and sixth data vias DQV6 and DQV7 may be arranged in the upper portion of the fourth data via region DQVA4, and the seventh and eighth data vias DQV2 and DQV3 may be arranged in the lower portion of the fourth data via region DQVA4.

Figure 11:
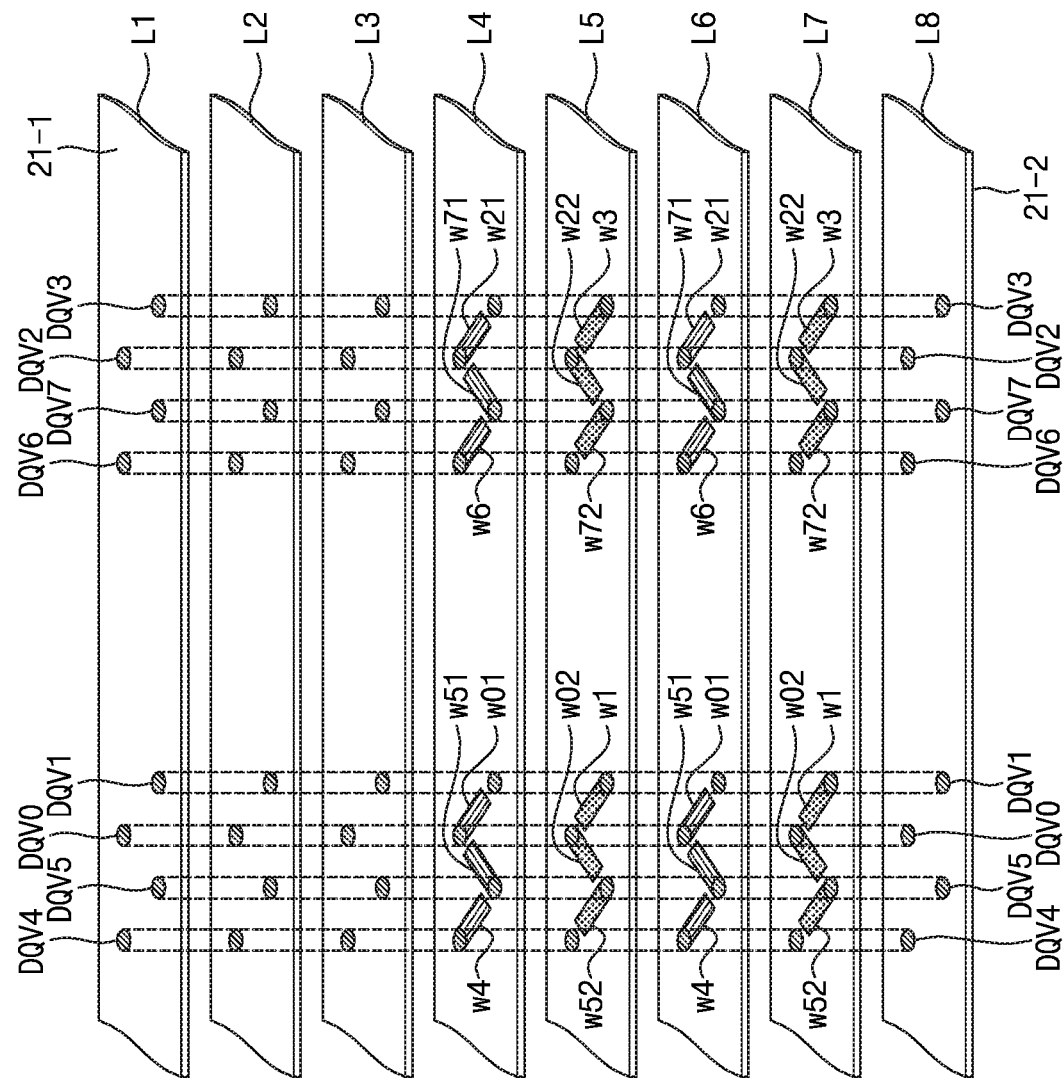
FIG. 11 is a diagram illustrating arrangements of data vias of a module board of a memory module according to some example embodiments of the present inventive concepts.

FIG. 11 is a diagram illustrating arrangements of data via regions of the module board 21 of the memory module 20 according to some example embodiments of the present inventive concepts. The module board 21 may include eight layers L1 to L8.

Referring to FIG. 11, an upper surface 21-1 of a first layer L1 of the module board 21 may have the arrangements shown in FIG. 9 described above, and a lower surface 21-2 of an eighth layer L8 may have the arrangements shown in FIG. 10 described above. Like FIG. 5, the module board 21 may include first to eighth data vias DQV4, DQV5, DQV0, DQV1, DQV6, DQV7, DQV2, and DQV3 formed in each of the first to eighth layers L1 to L8. The first to eighth data vias DQV4, DQV5, DQV0, DQV1, DQV6, DQV7, DQV2, and DQV3 formed in the same position of each layer may be filled with conductive materials, and be connected to each other. Each of the first to eighth layers L1 to L8 may be an insulating layer. First to sixth data via wings w4, w51, w01, w6, w71, and w21 connected to the first, the second, the third, the fifth, the sixth, and the seventh data vias DQV4, DQV5, DQV0, DQV6, DQV7, and DQV2 arranged in the fourth layer L4 and the sixth layer L6 may extend to and may not be connected to the second, the third, the fourth, the sixth, the seventh, and the eighth data vias DQV5, DQV0, DQV1, DQV7, DQV2, and DQV3 adjacent thereto. Further, seventh to twelfth data via wings w52, w02, w1, w72, w22, and w3 connected to the second, the third, the fourth, the sixth, the seventh, and the eighth data vias DQV5, DQV0, DQV1, DQV7, DQV2, and DQV3 arranged in the fifth layer L5 and the seventh layer L7 may extend to and may not be connected to the first, the second, the third, the fifth, the sixth, and the seventh data vias DQV4, DQV5, DQV0, DQV6, DQV7, and DQV2 adjacent thereto.

The first to third data via wings w4, w51, and w01 arranged in the fourth layer L4 (and the sixth layer L6) and the seventh to ninth data via wings w52, w02, and w1 arranged in the fifth layer L5 (and the seventh layer L7) may be conductive plates arranged to overlap each other in a zigzag line, and first coupling capacitors (and second coupling capacitors) may be formed by an insulating layer arranged between the conductive plates. The fourth to sixth data via wings w6, w71, and w21 arranged in the fourth layer L4 (and the sixth layer L6) and the tenth to twelfth data via wings w72, w22, and w3 arranged in the fifth layer L5 (and the seventh layer L7) may be conductive plates arranged to overlap each other in a zigzag line, and first coupling capacitors (and second coupling capacitors) may be formed by an insulating layer arranged between the conductive plates. The first coupling capacitors and the second coupling capacitors may be connected to each other in parallel.

A data transmission speed of the case in which two pieces of data having different levels are transmitted through the adjacent two data lines DQL4 and DQL5, DQL5 and DQL0, DQL0 and DQL1, DQL1 and DQL6, DQL6 and DQL7, DQL7 and DQL2, or DQL2 and DQL3 of the main board 30 (in the odd mode) may be greater than that of the case in which two pieces of data having the same level are transmitted through the adjacent two data lines DQL4 and DQL5, DQL5 and DQL0, DQL0 and DQL1, DQL1 and DQL6, DQL6 and DQL7, DQL7 and DQL2, or DQL2 and DQL3 (in the even mode). In this case, the first coupling capacitors and the second coupling capacitors formed between the data via wings w4 and w52, w51 and w02, w01 and w1, w6 and w72, w71 and w22, and w21 and w3 arranged to overlap each other may delay the data transmission speed of the case in which two pieces of data having different levels are transmitted between the adjacent two data lines DQL4 and DQL5, DQL5 and DQL0, DQL0 and DQL1, DQL1 and DQL6, DQL6 and DQL7, DQL7 and DQL2, or DQL2 and DQL3 of the main board 30, and thus a data transmission speed difference between the case in which the two pieces of data having different levels are transmitted (the odd mode) and the case in which the two pieces of data having the same level are transmitted (the even mode) may be decreased. Accordingly, signal integrity may be improved.

Figure 12:
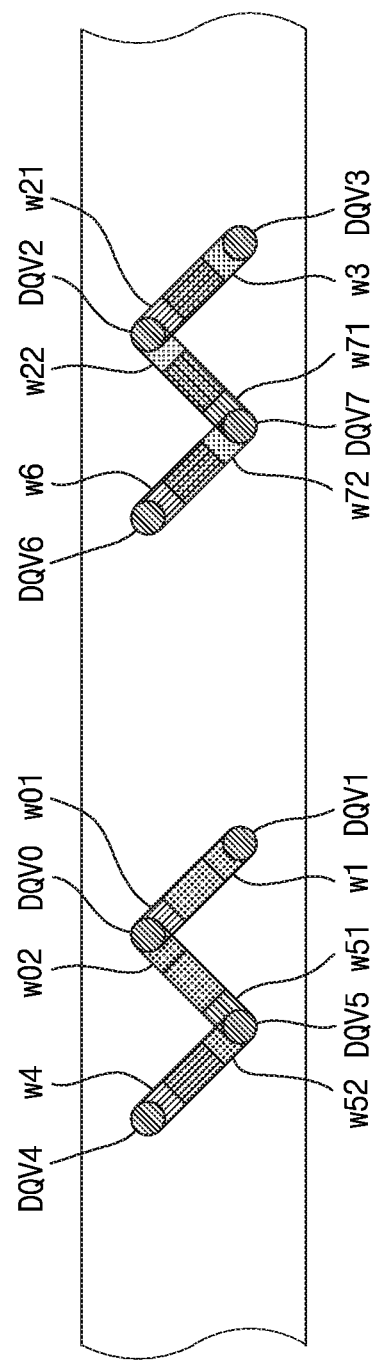
FIG. 12 is a plan view of the upper surface of the module board of the memory module shown in FIG. 11.

FIG. 12 is a plan view of the upper surface 21-1 of the module board 21 of the memory module 20 shown in FIG. 11. The first to sixth data via wings w4, w51, w01, w6, w71, and w21 may be arranged to overlap the seventh to twelfth data via wings w52, w02, w1, w72, w22, and w3, respectively. Further, as described above, the first to third data via wings w4, w51, and w01, and the fourth to sixth data via wings w6, w71, and w21 may be arranged in zigzag lines, and the seventh to ninth data via wings w52, w02, and w1, and the tenth to twelfth data via wings w72, w22, and w3 may be arranged in zigzag lines.

As an alternative to FIG. 12, a direction of the zigzag lines of the first to third data via wings w4, w51, and w01, and the seventh to ninth data via wings w52, w02, and w1 may be different from a direction of the zigzag lines of the fourth to sixth data via wings w6, w71, and w21, and the tenth to twelfth data via wings w72, w22, and w3. For example, positions of the sixth data via DQV7 and the seventh data via DQV2 may be exchanged, and thus the directions of the zigzag lines of the fourth to sixth data via wings w6, w71, and w21, and the zigzag lines of the tenth to twelfth data via wings w72, w22, and w3 may be changed.

According to the example embodiments of the present inventive concepts shown in FIGS. 5, 7, and 11, the example, in which the first coupling capacitors formed between the first to sixth data via wings w4, w51, w01, w6, w71, and w21 and the seventh to twelfth data via wings w52, w02, w1, w72, w22, w3 arranged on the fourth layer L4 and the fifth layer L5, and the second coupling capacitors formed between the first to sixth data via wings w4, w51, w01, w6, w71, and w21 and the seventh to twelfth data via wings w52, w02, w1, w72, w22, w3 arranged in the sixth layer L6 and the seventh layer L7 are formed in the module board 21, and thus the data transmission speed is decreased, is described above.

However, when the data transmission speed difference can be sufficiently decreased using only the first coupling capacitors, the second coupling capacitors may not be needed. As another example, when the data transmission speed difference cannot be sufficiently decreased using the first coupling capacitors and the second coupling capacitors, third coupling capacitors may be further formed in adjacent other layers (for example, the second layer L2 and the third layer L3).

In the example embodiments described above, the example in which the data vias are arranged in a line or two rows in the data via regions is illustrated, but the data vias may be arranged in various forms. The data via wings may be arranged to overlap each other to form the coupling capacitors between the data vias arranged in the adjacent layers of the module board 21 of the memory module 20 corresponding to the adjacent data lines on the main board 30 shown in FIG. 1. Although not shown, data input and output vias connected to data input and output terminals (for example, balls) of the semiconductor memory devices M11 to M1n arranged in the upper surface 21-1 of the module board 21 shown in FIG. 1 may be formed to pass through the first to eighth layers L1 to L8 shown in FIG. 5, 7, or 11. Further, although not shown, the data input and output via corresponding to the data via shown in FIG. 5, 7, or 11 may be connected by a line in one among the first to eighth layers L1 to L8. For example, the first data via DQV4 of the fourth layer L4 and a first data input and output via of the fourth layer L4 may be connected by one line arranged on the fourth layer L4, and the second data via DQV5 of the fifth layer L5 and a second data input and output via of the fifth layer L5 may be connected by another line arranged on the fifth layer L5.

In the example embodiments described above, the example of forming the first or second coupling capacitors in the module board 21 in order to decrease the data transmission speed difference between the data transmitted through the data lines adjacent to each other in the outside or otherwise external to the module board 21 is described above. However, the first or second coupling capacitors may be formed in the module board 21 in order to decrease the data transmission speed difference between the command and address signals transmitted through lines adjacent to each other of the first and second command and address lines CAL1 and CAL2 shown in FIG. 1 configured to transmit a command and address as well as the data lines adjacent to each other external to the module board 21.

In the example embodiments described above, a capacitance of each of the first and second coupling capacitors may be adjusted according to a distance, or an area between the data via wings forming each of the first and second coupling capacitors.

Further, in the example embodiments described above, although not shown, the data via wing may be formed to extend to and not connected to the adjacent data via while surrounding the corresponding data via.

According to the example embodiments of the present inventive concepts, the memory module and the memory system form the coupling capacitors between the data vias formed in the module board corresponding to the data lines arranged adjacent to each other, and decrease the data transmission speed difference between the case in which the different pieces of data (e.g., different bits) are transmitted through the data lines arranged adjacent to each other and the case in which identical pieces of data (e.g., the same bits) are transmitted through the data lines. Accordingly, the signal integrity may be improved.

While the embodiments of the present inventive concepts have been described with reference to the accompanying drawings, it should be understood by those skilled in the art that various modifications may be made without departing from the scope of the present inventive concepts and without changing essential features thereof. Therefore, the above-described embodiments should be considered in a descriptive sense only and not for purposes of limitation.

What is claimed is:

1. A memory module, comprising:
a module board comprising first and second data vias configured to transmit first and second data, respectively, through first and second data lines arranged adjacent to each other external to the module board, and a plurality of layers including the first and second data vias passing therethrough; and
a plurality of semiconductor memory devices arranged on at least one outer surface of the module board,
wherein the plurality of layers comprises first and second layers arranged adjacent to each other, wherein the module board comprises a first data via wing extending from the first data via toward the second data via and not connected to the second data via in the first layer, and a seventh data via wing extending from the second data via toward the first data via and not connected to the first data via in the second layer, and wherein the first data via wing and the seventh data via wing overlap.

2. The memory module of claim 1, wherein:
the module board further comprises a third data via configured to transmit third data and a fourth data via configured to transmit fourth data, in each of the plurality of layers; and
the third data and the fourth data are transmitted through third and fourth data lines arranged adjacent to each other external to the memory module, and the second data line and the third data line are arranged adjacent to each other.

3. The memory module of claim 2, wherein the third and fourth data vias pass through the plurality of layers, and the module board further comprises:
a second data via wing extending from the second data via toward the third data via and not connected to the third data via, and a third data via wing extending from the third data via toward the fourth data via and not connected to the fourth data via in the first layer, and an eighth data via wing extending from the third data via toward the second data via and not connected to the second data via and to overlap the second data via wing, and a ninth data via wing extending from the fourth data via toward the third data via and not connected to the third data via and to overlap the third data via wing in the second layer; or
the eighth data via wing extending from the third data via toward the second data via and not connected to the second data via, and the third data via wing extending from the third data via toward the fourth data via and not connected to the fourth data via in the first layer, and a second data via wing extending from the second data via toward the third data via and not connected to the third data via and to overlap the eighth data via wing, and a ninth data via wing extending from the fourth data via toward the third data via and not connected to the third data via and to overlap the third data via wing in the second layer.

4. The memory module of claim 3, wherein:
each of the first, the second, the third, the seventh, the eighth, and the ninth data via wings is a conductive plate; and
first coupling capacitors are defined between the first and seventh data via wings, between the second and eighth data via wings, and between the third and ninth data via wings.

5. The memory module of claim 3, wherein the first, the second, the third, and the fourth data vias are arranged in a row, and wherein:
the first, the second, and the third data via wings are arranged in a row and the seventh, the eighth, and the ninth data via wings are arranged in a row; or
the first, the eighth, and the third data via wings are arranged in a row and the seventh, the second, and the ninth data via wings are arranged in a row.

6. The memory module of claim 3, wherein:
the first and third data vias are arranged in a first row and the second and fourth data vias are arranged in a second row, or the first and second data vias are arranged in the first row and the third and fourth data vias are arranged in the second row; and
the first, the second, and the third data via wings are arranged in a zigzag line, and the seventh, the eighth, and the ninth data via wings are arranged in a zigzag line.

7. The memory module of claim 3, wherein the plurality of layers further comprises a third layer and a fourth layer arranged adjacent to each other, and the module board further comprises:
- the first data via wing extending from the first data via toward the second data via and not connected to the second data via, the second data via wing extending from the second data via toward the third data via and not connected to the third data via, and the third data via wing extending from the third data via toward the fourth data via and not connected to the fourth data via in the third layer, and the seventh data via wing extending from the second data via toward the first data via and not connected to the first data via, the eighth data via wing extending from the third data via toward the second data via and not connected to the second data via to overlap the second data via wing, and the ninth data via wing extending from the fourth data via toward the third data via and not connected to the third data via to overlap the third data via wing in the fourth layer; or
- the first data via wing extending from the first data via toward the second data via and not connected to the second data via, the eighth data via wing extending from the third data via toward the second data via and not connected to the second data via, and the third data via wing extending from the third data via toward the fourth data via and not connected to the fourth data via in the third layer, and the seventh data via wing extending from the second data via toward the first data via and not connected to the first data via, the second data via wing extending from the second data via toward the third data via and not connected to the third data via to overlap the eighth data via wing, and the ninth data via wing extending from the fourth data via toward the third data via and not connected to the third data via to overlap the third data via wing in the fourth layer.

8. The memory module of claim 7, wherein:
- each of the first, the second, the third, the seventh, the eighth, and the ninth data via wings is a conductive plate; and
- first coupling capacitors are defined between the first and seventh data via wings, between the second and eighth data via wings, and between the third and ninth data via wings, which are arranged in the first and second layers, and second coupling capacitors are defined between the first and seventh data via wings, between the second and eighth data via wings, and between the third and ninth data via wings, which are arranged in the third and fourth layers.

9. The memory module of claim 7, wherein the first, the second, the third, and the fourth data vias are arranged in a row, and wherein:
- the first, the second, and the third data via wings are arranged in a row and the seventh, the eighth, and the ninth data via wings are arranged in a row; or
- the first, the eighth, the third data via wings are arranged in a row and the seventh, the second, and the ninth data via wings are arranged in a row.

10. The memory module of claim 7, wherein:
- the first and third data vias are arranged in a first row and the second and fourth data vias are arranged in a second row, or the first and second data vias are arranged in the first row and the third and fourth data vias are arranged in the second row; and
- the first, the second, and the third data via wings are arranged in a zigzag line, and the seventh, the eighth, and the ninth data via wings are arranged in a zigzag line.

11. The memory module of claim 3, wherein the module board further comprises:
- a first data terminal connected to the first data line;
- a first resistor terminal connected to the first data terminal;
- a second resistor terminal arranged adjacent to the first resistor terminal and spaced apart from the first resistor terminal;
- a second data terminal connected to the second data line;
- a ninth resistor terminal connected to the second data terminal;
- a tenth resistor terminal arranged adjacent to the ninth resistor terminal and spaced apart from the ninth resistor terminal;
- a third data terminal connected to the third data line;
- a third resistor terminal connected to the third data terminal;
- a fourth resistor terminal arranged adjacent to the third resistor terminal and spaced apart from the third resistor terminal;
- a fourth data terminal connected to the fourth data line;
- an eleventh resistor terminal connected to the fourth data terminal; and
- a twelfth resistor terminal arranged adjacent to the eleventh resistor terminal and spaced apart from the eleventh resistor terminal,
- which are arranged on at least one of an upper surface or a lower surface of the module board,
- wherein the first data via is connected to the second resistor terminal, the second data via is connected to the tenth resistor terminal, the third data via is connected to the fourth resistor terminal, and the fourth data via is connected to the twelfth resistor terminal.

12. The memory module of claim 11, wherein:
- the first data terminal, the first resistor terminal, the second resistor terminal, the third data terminal, the third resistor terminal, and the fourth resistor terminal are arranged on the upper surface; and
- the second data terminal, the ninth resistor terminal, the tenth resistor terminal, the fourth data terminal, the eleventh resistor terminal, and the twelfth resistor terminal are arranged on the lower surface.

13. The memory module of claim 12, wherein the module board further comprises:
- a first resistor configured to provide impedance matching interposed between the first resistor terminal and the second resistor terminal;
- a second resistor configured to provide impedance matching interposed between the third resistor terminal and the fourth resistor terminal;
- a fifth resistor configured to provide impedance matching interposed between the ninth resistor terminal and the tenth resistor terminal; and
- a sixth resistor configured to provide impedance matching interposed between the eleventh resistor terminal and the twelfth resistor terminal.

14. A memory system comprising:
- a controller;
- a memory module; and
- a main board comprising first and second data lines connecting the controller and the memory module and configured to transmit first and second data,
- wherein the memory module comprises a module board having a first data via configured to transmit the first data, a second data via configured to transmit the second data, a plurality of layers including the first data via and the second data via passing therethrough, and a plurality of semiconductor memory devices arranged on at least one outer side of the module board, and wherein the plurality of layers comprises first and second layers arranged adjacent to each other, wherein the module board comprises a first data via wing extending from the first data via toward the second data via and not connected to the second data via in the first layer, and a seventh data via wing extending from the second data via toward the first data via and not connected to the first data via in the second layer, and wherein the first data via wing and the seventh data via wing overlap.

15. The memory system of claim 14, wherein:

the main board further comprises a third data line and a fourth data line arranged adjacent to each other between the controller and the memory module and configured to transmit third and fourth data;

the module board further comprises a third data via configured to transmit the third data and a fourth data via configured to transmit the fourth data passing through the plurality of layers, wherein the module board further comprises:

a second data via wing extending from the second data via toward the third data via and not connected to the third data via, and a third data via wing extending from the third data via toward the fourth data via and not connected to the fourth data via in the first layer, and an eighth data via wing extending from the third data via toward the second data via and not connected to the second data via to overlap the second data via wing, and a ninth data via wing extending from the fourth data via toward the third data via and not connected to the third data via to overlap the third data via wing in the second layer; or the eighth data via wing extending from the third data via toward the second data via and not connected to the second data via, and the third data via wing extending from the third data via toward the fourth data via and not connected to the fourth data via in the first layer, and a second data via wing extending from the second data via toward the third data via and not connected to the third data via to overlap the eighth data via wing, and a ninth data via wing extending from the fourth data via toward the third data via and not connected to the third data via to overlap the third data via wing in the second layer.

16. The memory system of claim 15, wherein:

each of the first, the second, the third, the seventh, the eighth, and the ninth data via wings is a conductive plate; and first coupling capacitors are defined between the first and seventh data via wings, between the second and eighth data via wings, and between the third and ninth data via wings.

17. The memory system of claim 15, wherein the plurality of layers further comprises a third layer and a fourth layer arranged adjacent to each other, and the module board further comprises:

the first data via wing extending from the first data via toward the second data via and not connected to the second data via, the second data via wing extending from the second data via toward the third data via and not connected to the third data via, and the third data via wing extending from the third data via toward the fourth data via and not connected to the fourth data via in the third layer, and the seventh data via wing extending from the second data via toward the first data via and not connected to the first data via to overlap the first data via wing, the eighth data via wing extending from the third data via toward the second data via and not connected to the second data via to overlap the second data via wing, and the ninth data via wing extending from the fourth data via toward the third data via and not connected to the third data via to overlap the third data via wing in the fourth layer; or the first data via wing extending from the first data via toward the second data via and not connected to the second data via, the eighth data via wing extending from the third data via toward the second data via and not connected to the second data via, and the third data via wing extending from the third data via toward the fourth data via and not connected to the fourth data via in the third layer, and the seventh data via wing extending from the second data via toward the first data via and not connected to the first data via, the second data via wing extending from the second data via toward the third data via and not connected to the third data via to overlap the eighth data via wing, and the ninth data via wing extending from the fourth data via toward the third data via and not connected to the third data via to overlap the third data via wing in the fourth layer.

18. The memory system of claim 17, wherein:

each of the first, the second, the third, the seventh, the eighth, and the ninth data via wings is a conductive plate; and first coupling capacitors are defined between the first and seventh data via wings, between the second and eighth data via wings, and between the third and ninth data via wings, which are arranged in the first and second layers, and second coupling capacitors are defined between the first and seventh data via wings, between the second and eighth data via wings, and between the third and ninth data via wings, which are arranged in the third and fourth layers.

19. The memory system of claim 17, wherein the first, the second, the third, and the fourth data vias are arranged in a row, and wherein:

the first, the second, and the third data via wings are arranged in a row and the seventh, the eighth, and the ninth data via wings are arranged in a row; or the first, the eighth, the third data via wings are arranged in a row and the seventh, the second, and the ninth data via wings are arranged in a row.

20. The memory system of claim 17, wherein:

the first and third data vias are arranged in a first row and the second and fourth data vias are arranged in a second row, or the first and second data vias are arranged in the first row and the third and fourth data vias are arranged in the second row; and the first, the second, and the third data via wings are arranged in a zigzag line, and the seventh, the eighth, and the ninth data via wings are arranged in a zigzag line.

21. The memory system of claim 17, wherein the module board further comprises:

a first data terminal connected to the first data line;

a first resistor terminal connected to the first data terminal;

a second resistor terminal arranged adjacent to the first resistor terminal and spaced apart from the first resistor terminal;

a second data terminal connected to the second data line;

a ninth resistor terminal connected to the second data terminal;

a tenth resistor terminal arranged adjacent to the ninth resistor terminal and spaced apart from the ninth resistor terminal;

a third data terminal connected to the third data line;

a third resistor terminal connected to the third data terminal;

a fourth resistor terminal arranged adjacent to the third resistor terminal and spaced apart from the third resistor terminal;

a fourth data terminal connected to the fourth data line;

an eleventh resistor terminal connected to the fourth data terminal; and a twelfth resistor terminal arranged adjacent to the eleventh resistor terminal and spaced apart from the eleventh resistor terminal, which are arranged on at least one of an upper surface or a lower surface of the module board, wherein the first data via is connected to the second resistor terminal, the second data via is connected to the tenth resistor terminal, the third data via is connected to the fourth resistor terminal, and the fourth data via is connected to the twelfth resistor terminal.

22. An arrangement method of a board, comprising:

forming first and second data vias passing through a plurality of layers adjacent to each other; and arranging a first data via wing to extend from the first data via toward the second data via and not connected to the second data via in a first layer among the plurality of layers, and arranging a seventh data via wing to extend from the second data via toward the first data via and not connected to the first data via, and to overlap the first data via wing, in a second layer arranged adjacent to the first layer, wherein the first data via is configured to transmit first data and the second data via is configured to transmit second data through first and second data lines arranged adjacent to each other.

23. The arrangement method of claim 22, further comprising:

forming a third data via and a fourth data via passing through the plurality of layers adjacent to each other; and arranging a second data via wing to extend from the second data via toward the third data via and not connected to the third data via, and a third data via wing to extend from the third data via toward the fourth data via and not connected to the fourth data via in the first layer, and arranging an eighth data via wing to extend from the third data via toward the second data via and not connected to the second data via and to overlap the second data via wing, and a ninth data via wing to extend from the fourth data via toward the third data via and not connected to the third data via and to overlap the third data via wing in the second layer, or arranging the eighth data via wing to extend from the third data via toward the second data via and not connected to the second data via, and the third data via wing to extend from the third data via toward the fourth data via and not connected to the fourth data via in the first layer, and arranging a second data via wing to extend from the second data via toward the third data via and not connected to the third data via and to overlap the eighth data via wing, and a ninth data via wing to extend from the fourth data via toward the third data via and not connected to the third data via and to overlap the third data via wing in the second layer, wherein the third data via is configured to transmit third data, the fourth data via is configured to transmit fourth data, the third data and the fourth data are configured to be transmitted through third and fourth data lines arranged adjacent to each other, and the second and third data lines are arranged adjacent to each other.

24. The arrangement method of claim 23, wherein:

each of the first, the second, the third, the seventh, the eighth, and the ninth data via wings is a conductive plate; and coupling capacitors are defined between the first and seventh data via wings, between the second and eighth data via wings, and between the third and ninth data via wings.

25. The arrangement method of claim 23, wherein the first, the second, the third, and the fourth data vias are arranged in a row, and wherein:

the first, the second, and the third data via wings are arranged in a row and the seventh, the eighth, and the ninth data via wings are arranged in a row; or the first, the eighth, and the third data via wings are arranged in a row and the seventh, the second, and the ninth data via wings are arranged in a row.

26. The arrangement method of claim 23, wherein:

the first and third data vias are arranged in a first row and the second and fourth data vias are arranged in a second row, or the first and second data vias are arranged in the first row and the third and fourth data vias are arranged in the second row; and the first, the second, and the third data via wings are arranged in a zigzag line, and the seventh, the eighth, and the ninth data via wings are arranged in a zigzag line.

* * * * *